(12) United States Patent
García Sosa

(10) Patent No.: US 9,444,263 B2
(45) Date of Patent: Sep. 13, 2016

(54) CURRENT-COORDINATING SYSTEM SUITABLE FOR THE REDUNDANCY OF ELECTRICAL EQUIPMENT

(76) Inventor: Francisco García Sosa, Las Palmas de Gran Canaria (ES)

(*) Notice: Subject to any disclaimer, the term of this patent is extended or adjusted under 35 U.S.C. 154(b) by 313 days.

(21) Appl. No.: 14/353,452

(22) PCT Filed: Oct. 28, 2011

(86) PCT No.: PCT/ES2011/070747
§ 371 (c)(1),
(2), (4) Date: Aug. 11, 2014

(87) PCT Pub. No.: WO2013/060905
PCT Pub. Date: May 2, 2013

(65) Prior Publication Data
US 2015/0002302 A1    Jan. 1, 2015

(51) Int. Cl.
*H02H 3/04* (2006.01)
*H02J 4/00* (2006.01)
*G06F 1/32* (2006.01)
*G01R 19/165* (2006.01)
*G08B 21/18* (2006.01)

(52) U.S. Cl.
CPC .......... *H02J 4/00* (2013.01); *G01R 19/16571* (2013.01); *G06F 1/3215* (2013.01); *G06F 1/3287* (2013.01); *G08B 21/182* (2013.01); *G06F 2200/261* (2013.01); *Y02B 60/1282* (2013.01); *Y02B 60/1296* (2013.01); *Y10T 307/469* (2015.04)

(58) Field of Classification Search
CPC .. H02J 4/00; H02J 5/00; H02J 50/00–50/90; G01R 19/16571; G01R 19/2516
USPC ...... 340/664; 307/38, 40, 41, 43, 46, 48, 29, 307/30, 126; 364/184, 141, 143, 492, 200, 364/900; 700/14, 296; 361/111
See application file for complete search history.

(56) References Cited

U.S. PATENT DOCUMENTS

| | | | | |
|---|---|---|---|---|
| 3,593,302 A * | 7/1971 | Saito | ...................... | G06F 13/4022 710/37 |
| 5,721,934 A * | 2/1998 | Scheurich | ................. | G06F 1/26 710/18 |
| 6,557,170 B1 * | 4/2003 | Wilder | ..................... | G06F 3/023 345/168 |
| 6,586,849 B2 * | 7/2003 | Tarr | ......................... | G06F 1/266 307/139 |
| 6,741,442 B1 * | 5/2004 | McNally | .................. | G06F 1/206 307/41 |

(Continued)

OTHER PUBLICATIONS

Japan Patent Application Publication No. JPH06-161802, (including Machine translation).

(Continued)

*Primary Examiner* — Steven Lim
*Assistant Examiner* — Mancil Littlejohn, Jr.
(74) *Attorney, Agent, or Firm* — Gary J. Gershik; Cooper & Dunham LLP

(57) ABSTRACT

The present invention relates to a system comprising an electric current supply device, said device in turn comprises a main outlet, where main electrical equipment is connected, and at least one secondary outlet where secondary electrical equipment is connected, the device is characterized by measuring with a consumption detector the electrical consumption level of the main electrical equipment and in the event of detecting a consumption level below a specific threshold, directing the current towards the at least one secondary outlet.

18 Claims, 9 Drawing Sheets

(56) References Cited

U.S. PATENT DOCUMENTS

| | | | |
|---|---|---|---|
| 8,093,750 B2* | 1/2012 | Ko | G06F 1/266 307/38 |
| 8,176,226 B2* | 5/2012 | Hsueh | G06F 3/023 710/10 |
| 8,271,815 B2* | 9/2012 | Lin | G06F 1/266 713/300 |
| 2003/0131177 A1* | 7/2003 | Ng | G06F 13/4022 710/313 |
| 2006/0175903 A1* | 8/2006 | Palmer | G06F 1/266 307/39 |
| 2008/0126629 A1* | 5/2008 | Huang | G06F 1/3203 710/64 |
| 2009/0125743 A1* | 5/2009 | Robertson | G06F 1/266 713/324 |
| 2010/0106884 A1* | 4/2010 | Abraham | G06F 3/0227 710/316 |

OTHER PUBLICATIONS

Japan Patent Application Publication No. P2008-261826A, (including Machine translation).
Japan Patent Application Publication No. JP2010-282161A, (including Machine translation).
Japan Patent Application Publication No. JP2011-137782A, (including Machine translation).
Nov. 4, 2015 Japanese Office Action.

\* cited by examiner

CURRENT-COORDINATING SYSTEM SUITABLE FOR THE REDUNDANCY OF ELECTRICAL EQUIPMENT

RELATED APPLICATIONS

This application is a §371 national stage of PCT International Application No. PCT/ES2011/070747, filed Oct. 28, 2011, the contents of each of which are hereby incorporated by reference into this application.

FIELD OF THE INVENTION

The present invention mainly relates to the apparatuses for controlling the electrical supply to electrical systems and more specifically to electrical supply apparatuses for redundant electrical systems with the possibility of including series of associated external devices.

BACKGROUND OF THE INVENTION

System redundancy is a technique that has been used for a long time to prevent the possible faults that may arise in electrical systems due to continued use.

It is presented as a solution to protection and reliability problems. In the redundant systems the same process is responsible for being performed in more than one station because if for any reason one stopped working or were to collapse, another one would immediately have to take its place and perform the tasks of the former.

A fault in the simplest element of a system of this type could have catastrophic consequences. For that reason, element duplication, the establishment of different paths between the same network elements, use of auxiliary power generators, a wide range of solutions assuring the stability of the system, are normally used.

Depending on the complexity, the cost, the consequences of a fault in a electrical system the redundancy can be approached in different ways and one of them consists of preparing a secondary electrical system that is a replica of the first which starts operating in the event of a fault in the main equipment, immediately replacing it. The coordination between the feed of said systems in the event of a fault must be approached by means of human intervention because the solutions lies in feeding them either from different sources and activating one upon detecting a fault in the one feeding the main electrical system, or from the same power source and connecting the secondary electrical system upon detecting a fault in the main system.

The power sources for these systems generally consist of multiple sockets such as the one described in EP2226905 and they often entail certain control measures or added functions like in patent KR20110056072, which describes the inclusion of a display in which, for example, the consumption is viewed, or United States patent US20070086126, where the designed circuitry seeks to cut off or allow the power supply to the socket depending on whether it detects short circuits or other electrical faults that could be dangerous.

United States patent US20100164284 establishes a master-slave relationship between the different outlets of a multiple socket such that it can remotely control switching on/off a series of electrical equipment associated with the main system. Nevertheless, the objective sought in this case is power saving.

All the proposed solutions require human intervention for using them with secondary equipment and in the event of having external devices connected to the main electrical system they do not propose any solution that does not lie in duplicating all the devices in the secondary electrical system. A device which allows making electrical systems redundant automatically and optimizing the duplication of devices without affecting the costs and complexity of internally handling the equipment is therefore necessary.

SUMMARY OF THE INVENTION

The present invention relates to a current coordinating system that is suitable for electrical equipment redundancy. Said system comprises an electric current supply device and said device in turn comprises:
 a main outlet to which current is supplied from a general power supply grid, main electrical equipment is connected to said main outlet;
 at least one secondary outlet where secondary electrical equipment is connected;
 the current supply device is characterized by measuring with a consumption detector the electrical consumption level of the main electrical equipment and in the event of detecting a consumption level below a specific threshold, also supplying current towards the at least one secondary outlet.

One aspect of the invention can additionally include a module connected to the electric current supply device, said module in turn comprises a first connector performing the function of data and/or signal input/output to/from the main electrical equipment, a second connector performing the function of data and/or signal input/output to/from the secondary electrical equipment and a third connector performing the function of data and/or signal input/output to/from an external peripheral device. The module establishes an interconnection between the external peripheral device and the main electrical equipment in the event that the consumption level of the main electrical equipment recorded by the consumption detector is greater than the threshold, or it establishes an interconnection between the external peripheral device and the secondary electrical equipment in the event that the consumption level of the main electrical equipment recorded by the consumption detector is less than the threshold. Several modules can also be connected in series and one without connectors can be placed as the final part like a cover.

In this case of having several modules connected in series, the connections can be established by means of DC-Jack type plugs. In the same manner the connection between the current supply device and the modules could also use a DC-Jack type plug.

When the present invention comprises one or several modules connected to the current supply device, it allows the interconnection, through these modules, of external peripheral devices to the main electrical equipment and to the secondary electrical equipment. The manner of coordinating the interconnection changes can be by means of sending a signal from the current supply device to the modules when a consumption level less than the threshold has been detected in the main electrical equipment, commanding to change the interconnection of the external peripheral devices from the main electrical equipment to the secondary electrical equipment.

The present invention can additionally include a consumption level regulator associated with the current supply device, configured for establishing the threshold from which it is considered that there is a fault in the main electrical equipment and the passage of current to the at least one secondary outlet is allowed. In the event that consumption is restored and a consumption level greater than the threshold is detected, current is no longer supplied to the at least one secondary outlet.

In one embodiment of the invention the connections in the main electrical outlet and the secondary electrical outlet of the current supply device are established by means of Schuko type plugs.

Another embodiment can comprise a plurality of secondary electrical outlets and warning systems, such as for example an alarm device connected in one of the secondary electrical outlets of the electric current supply device, said alarm device is activated when the consumption detector detects an electrical consumption level in the main electrical equipment less than the threshold and directs the current towards the plurality of secondary electrical outlets. Another system which can be included is a mobile telephone SMS warning system connected in one of the secondary electrical outlets of the electric current supply device, said mobile telephone SMS warning system is activated when the consumption detector detects an electrical consumption level in the main electrical equipment less than the threshold and directs the current towards the plurality of secondary electrical outlets.

A final aspect of the invention can comprise safety elements in different embodiments, such as for example a unipolar circuit breaker which cuts off the electrical supply of the entire system in the event of being operated. Or it can also comprise a thermal protector through which the current passes before reaching the main electrical outlet and the secondary electrical outlets protecting the apparatuses connected therein from over voltages and surge currents.

These and other aspects of the invention will be apparent from and elucidated with reference to the embodiments described hereinafter.

BRIEF DESCRIPTION OF THE DRAWINGS

To complete the description and in order to provide for a better understanding of the invention, a set of drawings is provided. Said drawings form an integral part of the description and illustrate preferred embodiments of the invention, which should not be interpreted as restricting the scope of the invention, but just as examples of how the invention can be embodied. The drawings comprise the following figures.

DETAILED DESCRIPTION OF THE PREFERRED EMBODIMENTS

Figure 1:
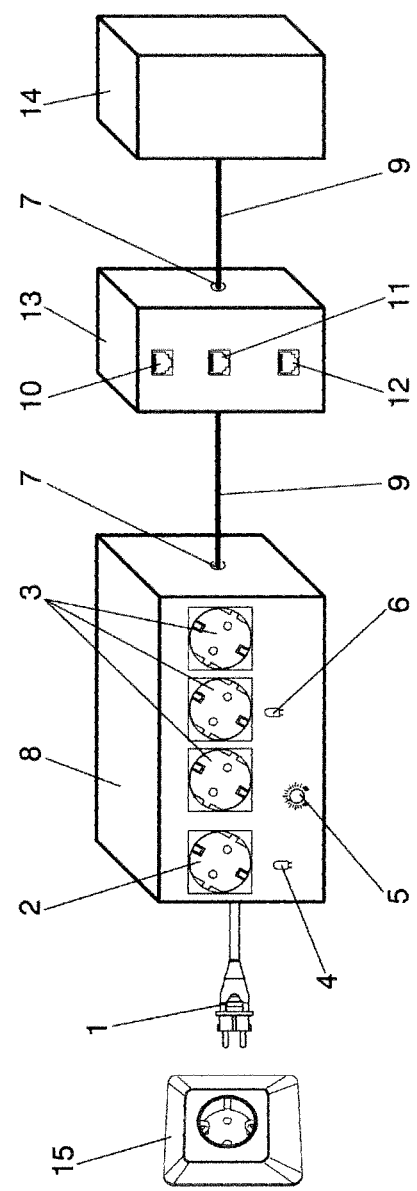
FIG. 1 shows the elements of the invention in a preferred embodiment.

In reference to the embodiment shown in FIG. 1, the present invention comprises an electric current supply device which is connected by means of a male Schuko type plug 1 to the general power supply grid 15 and through where electric current enters. The current supply device 8 in turn has a female Schuko type outlet 2 which will be referred to as "main outlet" and it is this outlet which receives the electric current supplied by the grid by default.

The current supply device also has a series of female Schuko type outlets 3 (3 outlets in the event of FIG. 1) referred to as "secondary outlets". These secondary outlets remain without electrical supply provided that electrical consumption is detected in the main outlet. An electrical consumption fault will be detected only when the electrical equipment connected to the main outlet is switched off or when it breaks down and the current supply device will supply electricity to the secondary outlets.

In one of the secondary outlets, secondary electrical equipment identical to the electrical equipment referred to as "main" equipment is connected such that the equipment is thus made redundant and prevents faults in the main system, assuring operation continuity. Warning systems, such as a light or sound alarm system or an SMS warning system, which are activated due to faults can in turn be connected in the free secondary outlets.

The current supply device comprises a pair of LEDs for representing the two possible states of the system, i.e., state A when there is electrical consumption in the main electrical outlet and at the same time the passage of current to the secondary electrical outlets is prevented, represented by means of switching on a LED light 4; and state B when there is no consumption in the main electrical outlet and therefore the passage of current to the secondary electrical outlets is allowed, represented by means of switching on a second LED light 6.

For regulating the point in which the system decides the limit at which the secondary electrical outlets have to receive current there is a regulator 5 for adjusting a threshold in a consumption sensor forming part of the device and this is what decides when there is and when there is no consumption in the main electrical outlet.

Given that there is always current supply in the main electrical outlet, in the event that the main electrical equipment again has an electrical consumption level greater than the established threshold, the secondary electrical outlets will again be left without electric current supply.

For connecting modules to the current supply device, the latter has a female DC-Jack connector. By means of a male and female bipolar DC-Jack type connector the correct connection of a positive pole and a negative pole is assured because direct current passes through the cable when the consumption level of the main electrical equipment is less than the threshold and it makes at least one relay changing the interconnections of the external devices, either with the main electrical equipment or with the secondary electrical equipment. An embodiment of the invention comprises one relay for each pin that the connectors of a module have.

In a preferred embodiment, the invention also has modules with three connectors each, which are connected by means of a male DC-Jack plug to the female DC-Jack connector of the electric current supply device and just as said device is configured for coordinating the electric current in the secondary electrical outlets, these modules are configured for coordinating the data and signals produced by external peripheral devices connected to the main electrical equipment between the three connectors, which are of the same type. The connectors could be of the following type: USB 2.0, RJ45, coaxial, DE-9 serial RS232, VGA/SVGA, RJ11, HDMI, eSATA, PS/2 keyboard, PS/2 mouse, Fireware 4-pin ilink, fireware 400 1394, fireware 800/32001394b/c, USB 3.0, output audio, input audio, SVHS, DVI, Digital audio RCA, parallel port, optical audio, SPFID, displayport, micro-DVI, DMS59 (dual DVI-D), LFH60 (dual DVI-D), Apple display connector—ADC, Apple Hi-Density Video HDI-45, Mini-VGA, Mini-DVI, mini displayport, mac video/MIDI/gameport/AUI/DA 15, paralellport/SCASI1/ DB 25-F, F connector RF/COAX, surround sound, 50 pin SCSI 2, centronic SCSI 50 pin, Centronics parallel 36 tpin, DB-25 serial/comport, DE-9F, AT keyboard, mac serial, Apple desktop bus—ADB, SCART connector, or any analog or digital connector. Therefore, when a fault occurs in the main electrical equipment and the secondary electrical equipment starts operating, all the external devices connected to the main electrical equipment are automatically connected to the secondary electrical equipment.

Given that there is always current supply in the main electrical outlet, in the event that the main electrical equipment again has an electrical consumption level greater than the established threshold, the secondary electrical outlets will again be left without electric current supply and all the connections of the external devices will automatically be re-established with the main electrical equipment.

The modules can be connected in series by means of a male DC-Jack type plug, one module is necessary for each external device and an end-of-chain module 14 that does not have connectors but protects the last female DC-Jack connection of the chain such that it is not exposed to the open air can optionally be placed at the end of the chain. FIG. 1 shows the module 13, a main connector 10 where the main electrical equipment is connected, a direct connector 11 where the external peripheral device is directly connected, a secondary connector 12 where the secondary electrical equipment is connected, the male connector 9 for the series connection and the female DC-Jack type connector 7 for the connection of the next module.

Figure 2:
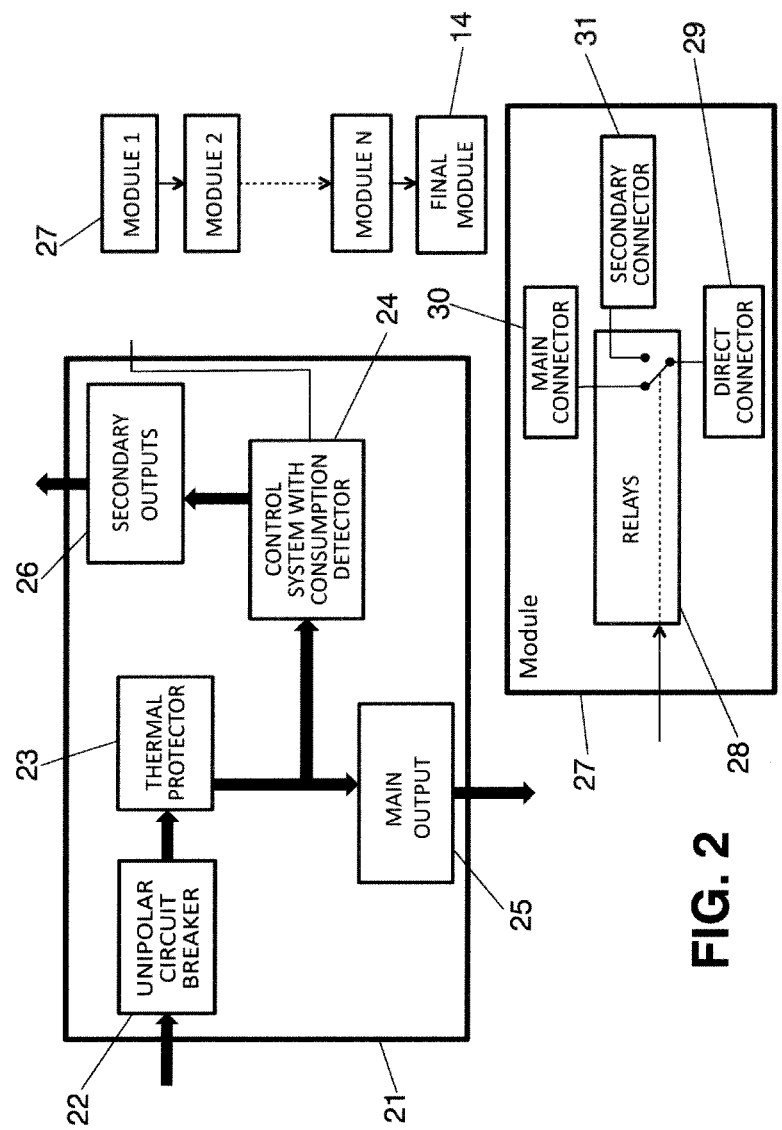
FIG. 2 shows a block diagram of the invention with its internal connections.

FIG. 2 schematically depicts an embodiment of the complete system where the relationship between the devices can be seen. The current supply device 21 receives the electricity from the general power supply grid, it then passes through the main electrical outlet 25 and also towards the secondary electrical outlets 26 depending on the reading provided by a consumption detector 24 and depending on whether or not the reading of the consumption exceeds the threshold established with the regulator 5. If it is less than said threshold, the current will also be directed to the secondary electrical outlets through means such as a current router connected to the consumption detector. A unipolar circuit breaker 22 can optionally be incorporated in the system which, by being placed between the electrical outlets and the general power supply grid, allows cutting off the current of the entire system. A thermal protector 23 can additionally be included before the electrical outlets for protecting the apparatuses connected in said electrical outlets against surge currents and over voltages.

The modules are connected with the current supply device. The first module 27 is analyzed in more detail and the chain continues until reaching a module without end-of-chain connectors 32. The module 27 comprises one or several relays 28 which depend on the state of the system. If the system is in state A, where there is consumption in the main electrical outlet, no electrical signal is emitted towards the relay or relays 28 and an interconnection between the direct connector 29 and main connector 30 is thereby established. This is the default configuration. In contrast, upon entering state B, where there is no consumption in the main electrical outlet and the secondary electrical outlets are fed, the relay or relays 28 receive an electronic signal and then change, and an interconnection between the direct connector 29 and secondary connector 31 is established.

In an embodiment of the invention, a light alarm or a sound alarm can be connected in one of the secondary electrical outlets. Therefore when a fault in the main electrical equipment is detected by means of the consumption detector and the secondary outlets are fed, the alarm is activated emitting a light or sound and capturing the attention of a person in charge as the secondary electrical equipment connected in one of the secondary electrical outlets automatically starts for assuring operation continuity.

In another embodiment, one of the secondary electrical outlets includes an SMS warning system. Therefore, when a fault is detected in the main electrical equipment by means of the consumption detector and the secondary outlets are fed, the SMS warning system is activated and sends an SMS to a person in charge, notifying him/her of the situation as the secondary electrical equipment connected in one of the secondary electrical outlets automatically starts up for assuring operation continuity.

Figure 3:
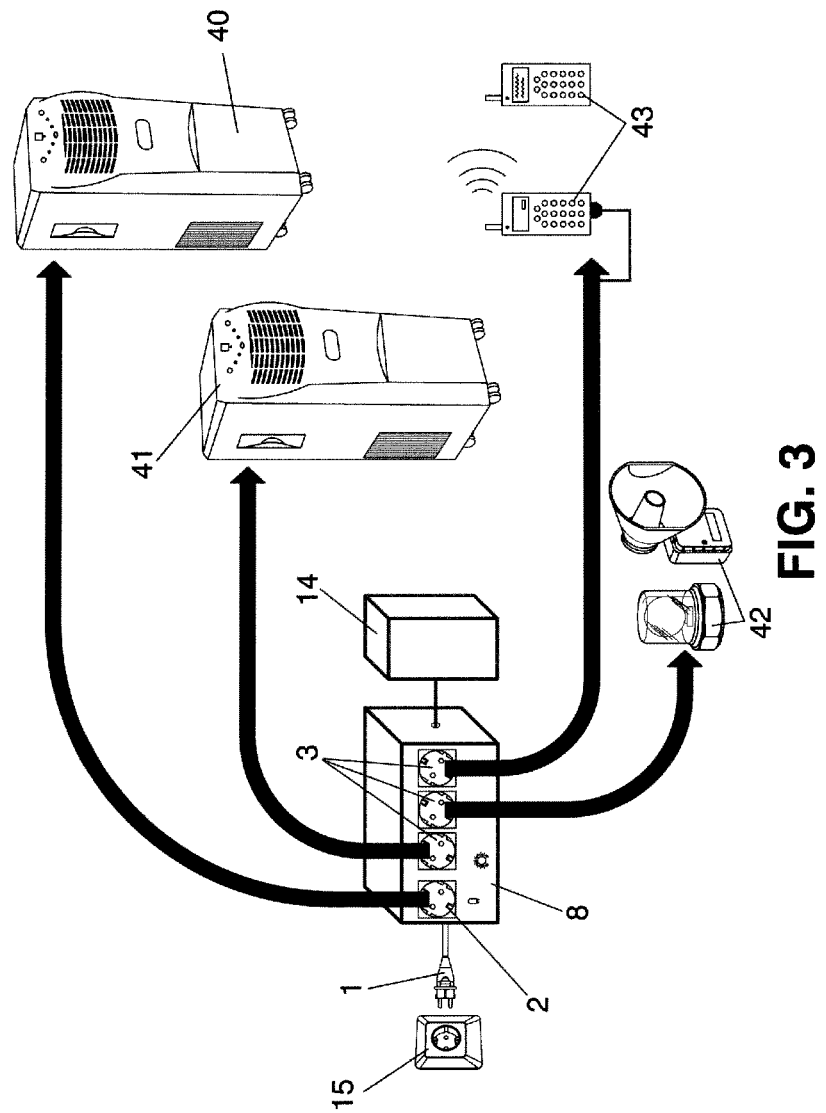
FIG. 3 shows an embodiment of the invention applied to an air conditioning system

FIG. 3 shows an embodiment of the invention in which the latter is used for making the operation of an air conditioning system redundant. An air conditioning system 40 is connected in the main electrical outlet 2 of the current supply device 8, which air conditioning system is considered the main electrical equipment or active system since it is in that main electrical outlet. A second air conditioning system, which will be the secondary electrical equipment or passive system (since it is generally shut off and only begins operating when the first one fails) is connected in one of the secondary electrical outlets 3. A light-sound alarm system 42 and an SMS warning system are in turn connected in the two free secondary outlets for notifying the staff in charge that there has been a fault in the main system and that the secondary equipment has started operating. Given that the nature of this air conditioning system does not require connections with external devices involving signals and data streams modules are not needed for connecting them. An end-of-chain module 14 is simply placed directly after the current supply device 8.

In this case, the main air conditioning equipment would be operating normally and in the event that any fault in its operation were to occur, the consumption detector would detect it upon recording a drop in or even a complete lack of consumption. In this situation, the secondary outlets would be activated immediately and the secondary air conditioning equipment would begin operating automatically as the alarm systems which would notify a person in charge of the situation that has taken place would be activated.

Figure 4:
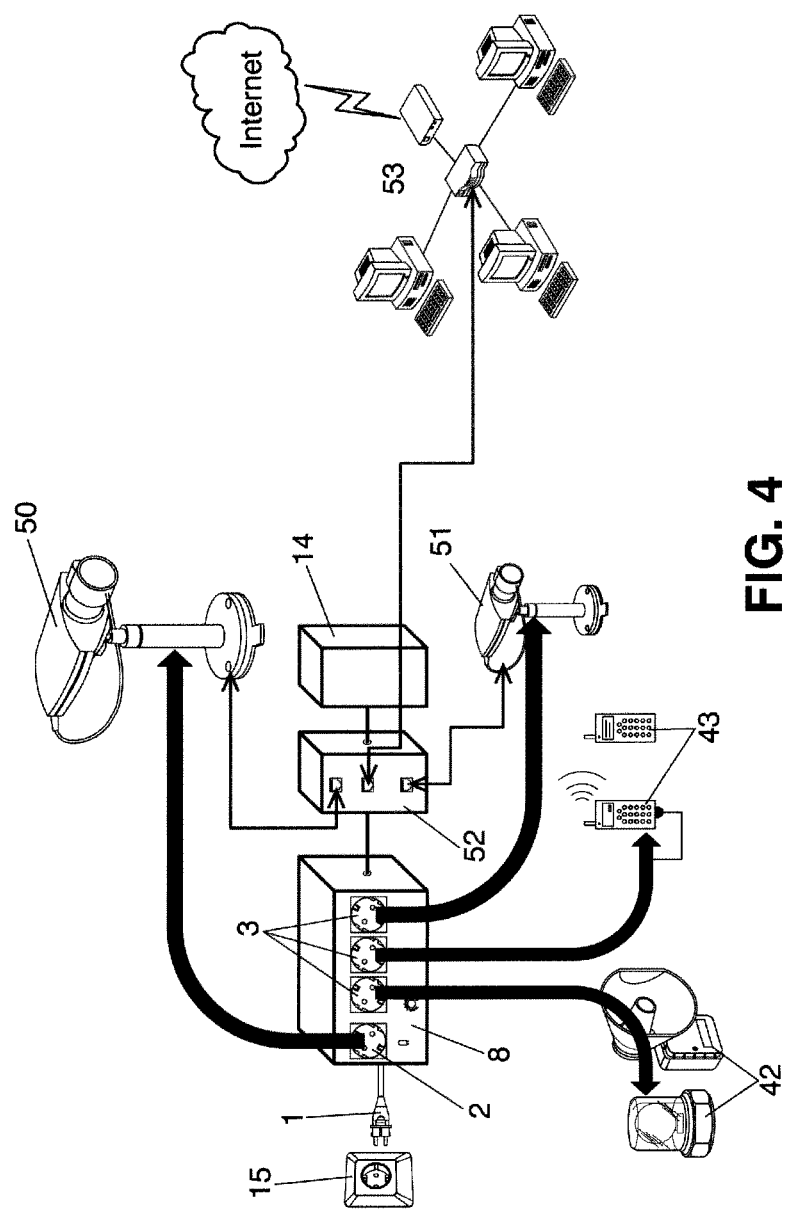
FIG. 4 shows an embodiment of the invention applied to an IP camera.

FIG. 4 depicts another application of the invention in which the objective is to make the operation of an IP camera redundant. As in the previous case, main electrical equipment, consisting of an IP camera 50, is connected in the main electrical outlet, and secondary electrical equipment 51 is connected in one of the secondary outlets. A light-sound alarm system and an SMS warning system are now also connected in the two secondary electrical outlets that are free. The difference with the previous case is that now a module 52 is used for establishing the necessary interconnections between a router 53 and the two IP cameras or main and secondary electrical equipment. As explained above in the operation of the modules, the external device (in this case the router) is connected in the direct connector 11 of the module, the main equipment or active IP camera is connected in the main connector 10 and the secondary equipment or passive IP camera is connected in the secondary connector 12.

In this case, the active IP camera is operating plugged into the main outlet and exchanging data with a router through a module. When there is a lack of consumption (calibrated by the regulator 5), the current supply device activates the secondary outlets immediately, allowing the passage of the current and automatically sends a signal to the module which changes the interconnection of the router, going from exchanging data and signals with the active IP camera to now doing this with the passive IP camera or secondary equipment. All the interconnections are established through the module in which each of the three connectors performs the function of input/output for the IP cameras and the router. The redundancy of the system thus occurs and operation continuity is assured without needing human intervention. In contrast, when the fault takes place light-sound alarm and SMS warning systems are activated for notifying the staff in charge of the situation that has taken place and they can determine if it is necessary to repair any apparatus or check the installation.

Figure 5:
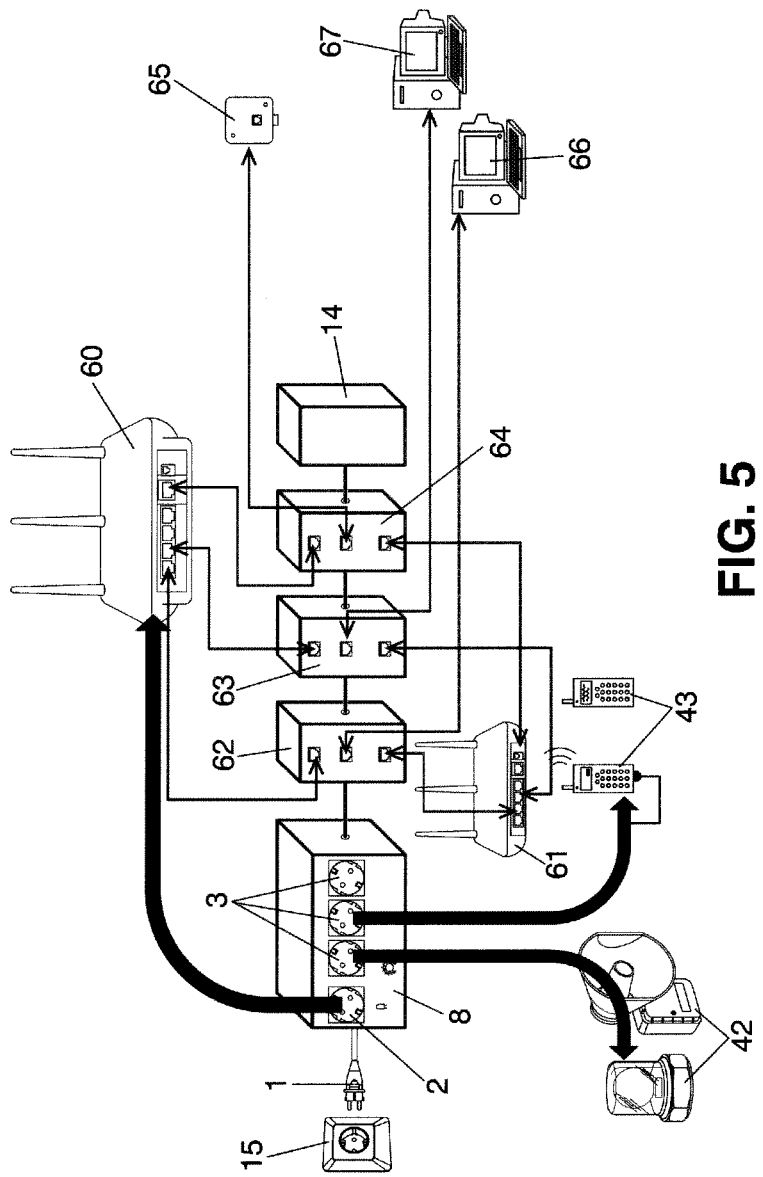
FIG. 5 shows an embodiment of the invention applied to a router.

An embodiment of the invention is used in FIG. 5 for making the operation of a router redundant. The difference with the previous cases consists of three modules being used now for establishing the necessary interconnections between the active router 60 (main electrical equipment) the passive router 61 (secondary electrical equipment) and the external peripheral devices connected through them, which are a telephone jack 65, a computer A 66 and a computer B 67. The modules are necessarily different from one another between due to the nature of the connectors. Two of them 62 and 63 have connectors suitable for connecting with computers A and B with which data and signals are exchanged and the third module 64 has different connectors which are required for being connected with the telephone jack. Despite being different, all the modules are connected in series and an end-of-chain module is placed at the end of the series.

In this case, the current supply device is in state A because a router (Router A) is connected and switched on in its main electrical outlet and there is electrical consumption in the main electrical outlet and at the same time the passage of current to the secondary electrical outlets where there is connected another router (Router B) configured for performing the same function as router A, is prevented; this situation is represented by means of switching on an LED light 4; in this state A the two modules RJ45 and module RJ11 which are interconnected with one another and in turn connected to the current supply apparatus, do not receive any electronic signal, which is the default state, connecting Router A directly to the switch 32 and to the telephone jack, and assuring that the signals passing through the FTP or UTP cable and the telephone cable are correctly routed. There is a possibility that the current supply device passes to a state B when there is no consumption in the main electrical outlet, and therefore the passage of current to the secondary electrical outlets is allowed, automatically switching on Router B; this state is represented by means of switching on a second LED light 6 and a low-voltage direct current electrical signal is furthermore and automatically emitted from the consumption detection system towards the modules, said signal reaching all the relays of the modules of the chain and connecting Router B directly to the switch 32 and to the telephone jack and assuring that the signals passing through the FTP or UTP cable and the telephone cable are correctly routed.

Figure 6:
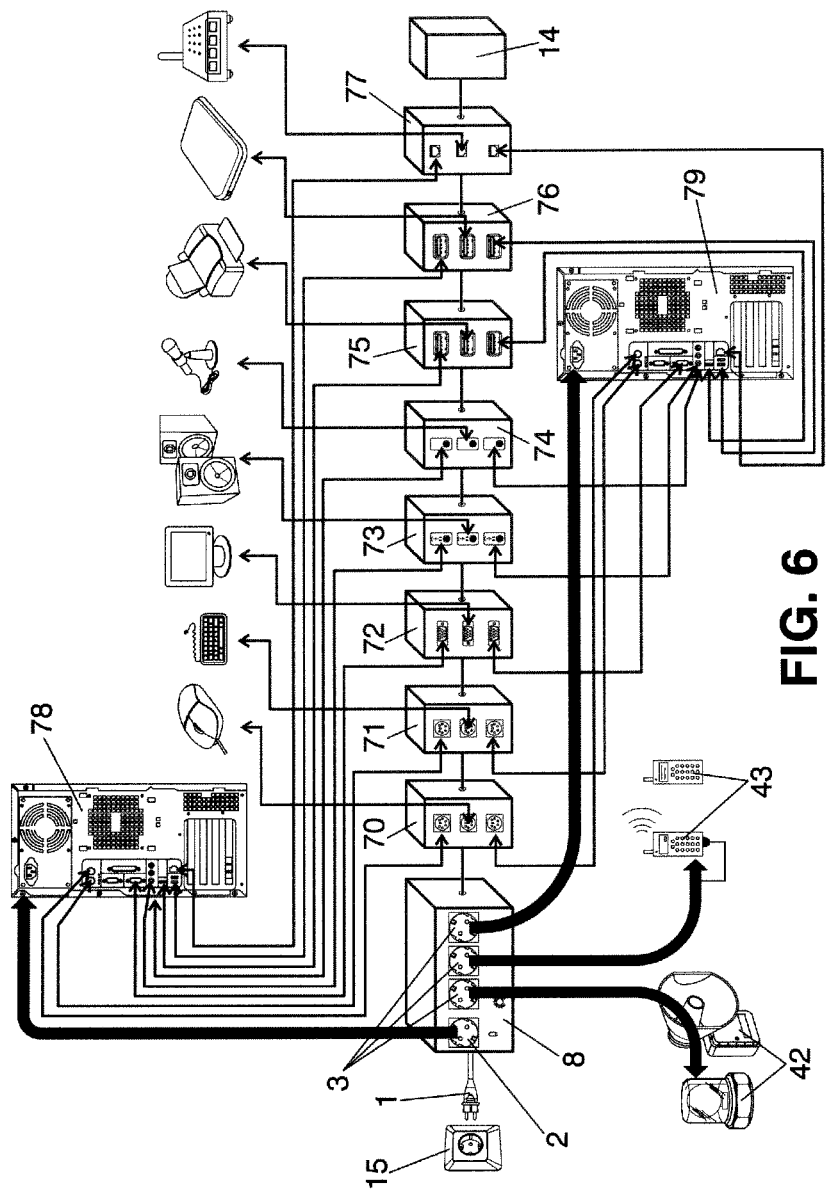
FIG. 6 shows an embodiment of the invention applied to a PC.

FIG. 6 shows an embodiment of the invention in which the latter is used for making the operation of a PC redundant. The main equipment (an active PC 78), the secondary equipment (a passive PC 79) and the light-sound and SMS warning alarms are connected in the same manner as in the previous cases, but now there is a multitude of external peripheral devices requiring the same number of modules that allow them to change their connections between the main system and the secondary system as the consumption detection system changes from state A to state B. In this case, all the modules are different from one another, the chain being formed by a PS2-mouse module 70 for connecting a mouse, a PS2-keyboard module 71 for connecting a keyboard, a VGA module 72 for connecting a monitor, an output audio module 73 for connecting speakers, an input audio module 74 for connecting a microphone, a USB 2.0 module 75 for connecting a printer, a USB 3.0 module 76 for connecting an external hard drive, an RJ 45 module 77 for connecting a router and an end-of-chain module.

In this case, there is a multitude of external peripheral devices exchanging data and signals, through individual modules, with a normally operating active PC connected in the main outlet of the current supply device. When there is a fault in the active PC, the consumption detector records a drop in the consumption level or a complete lack thereof, depending on the level at which the regulator 5 is situated, then the passive PC is fed by the current activating the secondary outlets and at the same time is interconnected with all the external peripheral devices through the chain of modules as a result of the relays which immediately switch upon receiving the command from the current supply device. The system therefore continues to operate unaltered and continuity is maintained despite the fault in the main equipment. The alarm systems notify the staff in charge in case they decide that some other type of action is necessary, such as starting up the main equipment again, changing parts, repairing parts.

Figure 7:
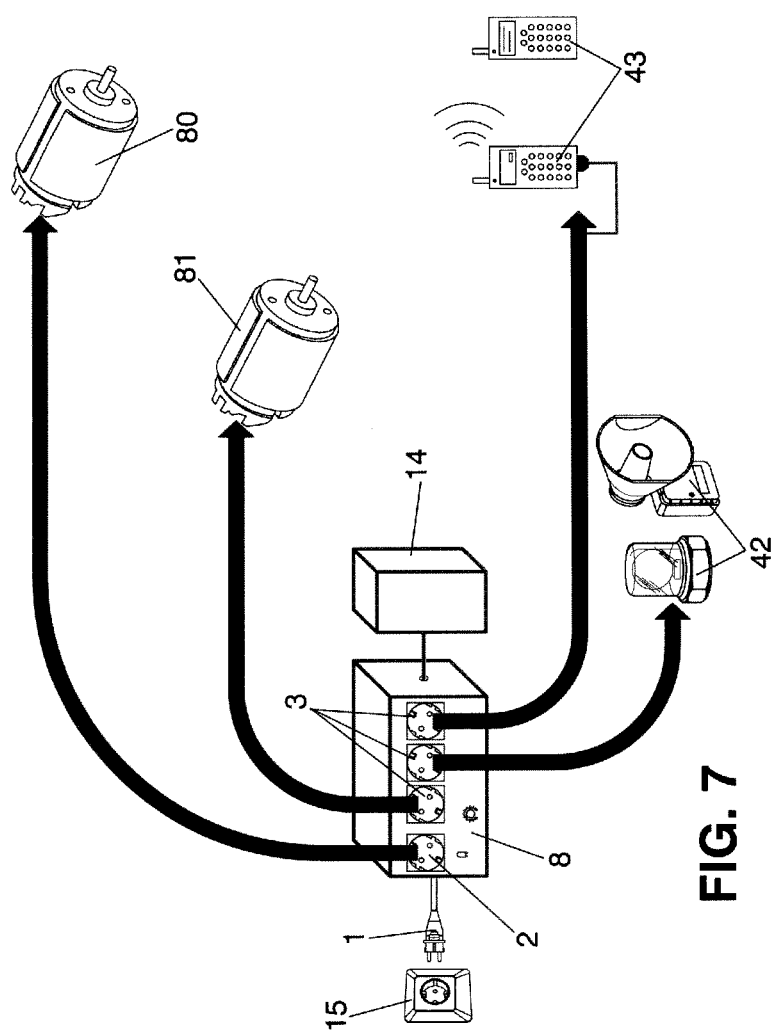
FIG. 7 shows an embodiment of the invention applied to an electric motor.

FIG. 7 shows an application of an embodiment of the invention which consists of making an electric motor redundant. The active motor 80 or main electrical equipment is connected in the main electrical outlet and the passive motor 81 or secondary electrical equipment is connected in one of the secondary electrical outlets. It also has a light-sound alarm system and an SMS warning system connected in the two free secondary electrical outlets of the electric current supply device. Since there are no external devices that require exchanging data and signals with the motors in this embodiment, no more modules than simply an end-of-chain module without connectors and directly connected to electric current supply device are necessary.

Figure 8:
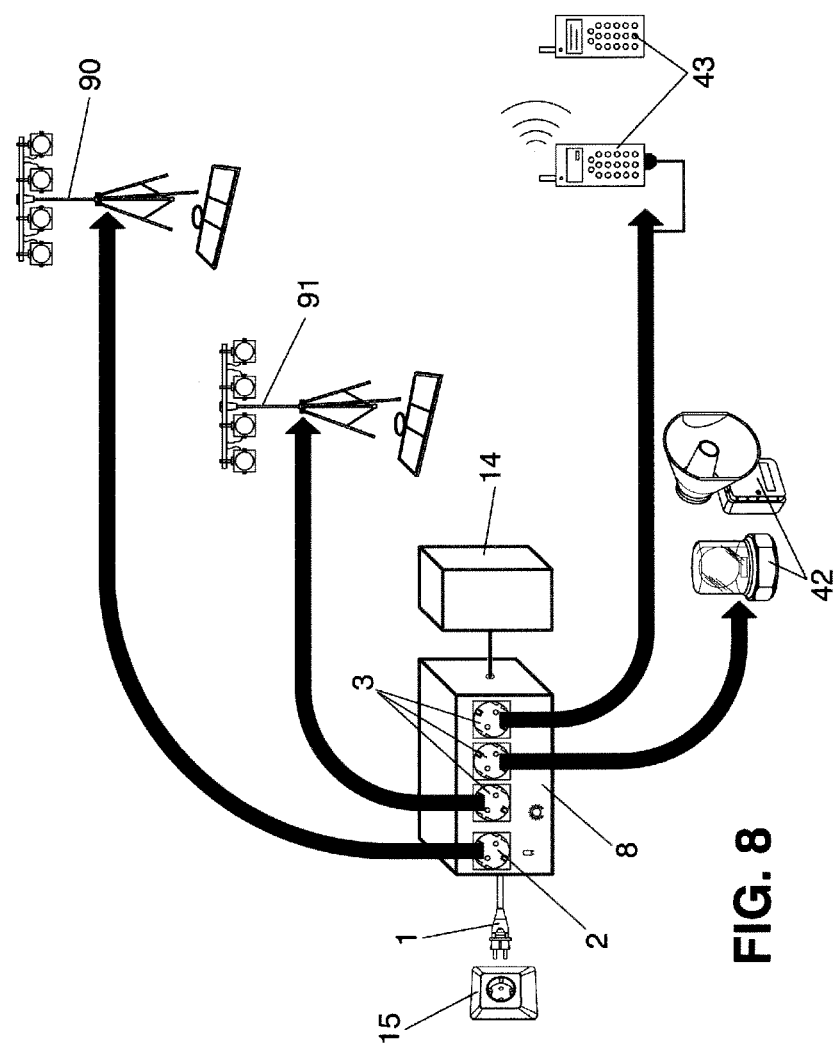
FIG. 8 shows an embodiment of the invention applied to a lighting system.

FIG. 8 shows an application of an embodiment of the invention which consists of making a lighting system redundant. The active lighting system 90 or main electrical equipment is connected in the main electrical outlet and the passive lighting system 91 or secondary electrical equipment is connected in one of the secondary electrical outlets. It also has a light-sound alarm system and an SMS warning system connected in the two free secondary electrical outlets of the electric current supply device. Since there are no external devices that require exchanging data and signals with the lightening system in this embodiment, no more modules than simply an end-of-chain module without connectors and directly connected to electric current supply device are necessary.

Figure 9:
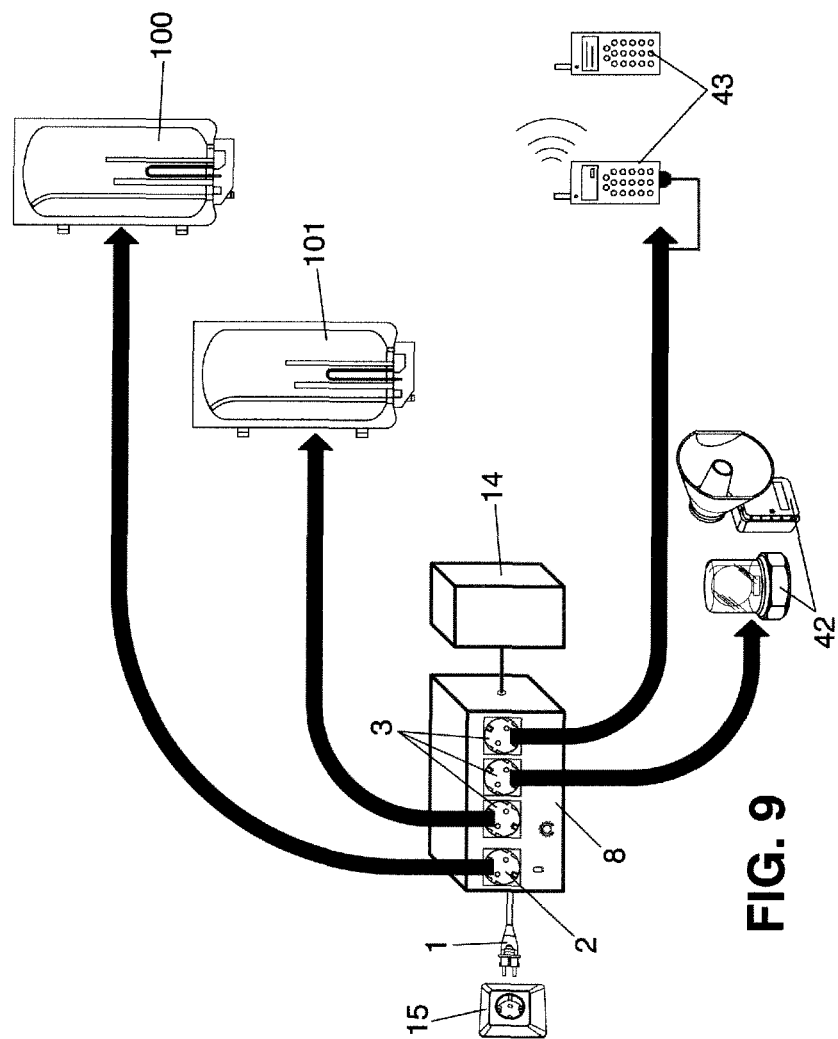
FIG. 9 shows an embodiment of the invention applied to an electric water heater.

FIG. 9 shows an application of an embodiment of the invention which consists of making an electric water heater redundant. The active electric water heater 100 or main electrical equipment is connected in the main electrical outlet and the passive electric water heater 101 or secondary electrical equipment is connected in one of the secondary electrical outlets. It also has a light-sound alarm system and an GMS warning system connected in the two free secondary electrical outlets of the electric current supply device. Since there are no external devices that require exchanging data and signals with the electric water heater in this embodiment, no more modules than simply an end-of-chain module without connectors and directly connected to electric current supply device are necessary.

It is to be understood that the above disclosure is an exemplification of the principles of the invention and does not limit the invention to the described embodiments.

The invention claimed is:

1. A system for redundancy of electrical equipment comprising an electric current supply and a consumption detector the system comprising:
   a. a main outlet in the electric current supply device, to which current is supplied from a general power supply grid, to which main outlet main electrical equipment is connected;
   b. at least one secondary outlet in the electric current supply device, where secondary electrical equipment is connected and, in the event of a fault occurring in the main electrical equipment, the consumption detector detects a consumption level below a specific threshold and said at least one secondary outlet also receives current to put into operation the secondary electrical equipment,
   c. a module connected to the electric current supply device, said module comprising a first connector performing the function of data and/or signal input/output to/from the main electrical equipment, a second connector performing the function of data and/or signal input/output to/from the secondary electrical equipment and a third connector performing the function of data and/or signal input/output to/from an external peripheral device, said module establishes an interconnection between the external peripheral device and the main electrical equipment in the event that the consumption level of the main electrical equipment recorded by the consumption detector is greater than the threshold, or said module establishes an interconnection between the external peripheral device and the secondary electrical equipment in the event that the consumption level of the main electrical equipment recorded by the consumption detector is less than the threshold.

2. The system according to claim 1 comprising a plurality of modules connected in series.

3. The system according to claim 1 which further comprises sending a signal from the current supply device to the module, when a consumption level less than the threshold has been detected in the main electrical equipment, commanding to change the interconnection of the external peripheral device from the main electrical equipment to the secondary electrical equipment.

4. The system according to claim 1, wherein the current supply device further comprises a consumption level regulator configured for establishing the threshold from which it is considered that there is a fault in the main electrical equipment and the passage of current to the at least one secondary outlet is allowed.

5. The system according to claim 1, wherein in the event of detecting a consumption level greater than the threshold current is no longer supplied to the at least one secondary outlet.

6. The system according to claim 1, wherein the connections in the main electrical outlet and the secondary electrical outlet of the current supply device are established by means of Schuko type plugs.

7. The system according to claim 1, wherein the connections between the current supply device and the module are established by means of DC-Jack type plugs.

8. The system according to claim 2, wherein the connections between the modules connected in series are established by means of DC-Jack type plugs.

9. The system according to claim 1, further comprising a plurality of secondary electrical outlets and an alarm device connected in one of the secondary electrical outlets of the electric current supply device, said alarm device is activated when the consumption detector detects an electrical consumption level in the main electrical equipment less than the threshold and directs the current towards the plurality of secondary electrical outlets.

10. The system according to claim 1, further comprising a plurality of secondary electrical outlets and a mobile telephone SMS warning system connected in one of the secondary electrical outlets of the electric current supply device, said mobile telephone SMS warning system is activated when the consumption detector detects an electrical consumption level in the main electrical equipment less than the threshold and directs the current towards the plurality of secondary electrical outlets.

11. The system according to claim 1, further comprising a unipolar circuit breaker which cuts off the electrical supply of the entire system in the event of being operated.

12. The system according to claim 1, further comprising a thermal protector through which the current passes before reaching the main electrical outlet and the secondary electrical outlets protecting the apparatuses connected therein from over voltages and surge currents.

13. The system according to claim 3, wherein the current supply device further comprises a consumption level regulator configured for establishing the threshold from which it is considered that there is a fault in the main electrical equipment and the passage of current to the at least one secondary outlet is allowed.

14. The system according to claim 13, wherein in the event of detecting a consumption level greater than the threshold current is no longer supplied to the at least one secondary outlet.

15. The system according to claim 14, further comprising a plurality of secondary electrical outlets and an alarm device connected in one of the secondary electrical outlets of the electric current supply device, said alarm device is activated when the consumption detector detects an electrical consumption level in the main electrical equipment less than the threshold and directs the current towards the plurality of secondary electrical outlets.

16. The system according to claim 15, further comprising a plurality of secondary electrical outlets and a mobile telephone SMS warning system connected in one of the secondary electrical outlets of the electric current supply device, said mobile telephone SMS warning system is activated when the consumption detector detects an electrical consumption level in the main electrical equipment less than the threshold and directs the current towards the plurality of secondary electrical outlets.

17. The system according to claim 16, further comprising a unipolar circuit breaker which cuts off the electrical supply of the entire system in the event of being operated.

18. The system according to claim 17, further comprising a thermal protector through which the current passes before reaching the main electrical outlet and the secondary electrical outlets protecting the apparatuses connected therein from over voltages and surge currents.

* * * * *